(12) United States Patent
Yi et al.

(10) Patent No.: US 12,175,788 B2
(45) Date of Patent: Dec. 24, 2024

(54) DISPLAY DEVICE

(71) Applicant: Wuhan China Star Optoelectronics Semiconductor Display Technology Co., Ltd., Wuhan (CN)

(72) Inventors: Shijuan Yi, Wuhan (CN); Liang Sun, Wuhan (CN); Mian Zeng, Wuhan (CN); Pengfei Jiang, Wuhan (CN); Likun Cheng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/621,843

(22) PCT Filed: Dec. 13, 2021

(86) PCT No.: PCT/CN2021/137475
§ 371 (c)(1),
(2) Date: Dec. 22, 2021

(87) PCT Pub. No.: WO2023/102954
PCT Pub. Date: Jun. 15, 2023

(65) Prior Publication Data
US 2024/0312238 A1    Sep. 19, 2024

(30) Foreign Application Priority Data

Dec. 7, 2021 (CN) .......................... 202111486764.2

(51) Int. Cl.
*G06K 9/00* (2022.01)
*G02F 1/1362* (2006.01)
(Continued)

(52) U.S. Cl.
CPC .... *G06V 40/1306* (2022.01); *G02F 1/136227* (2013.01); *G02F 1/136286* (2013.01);
(Continued)

(58) Field of Classification Search
CPC .......... G06V 40/1306; G02F 1/136227; G02F 1/136286; G02F 1/1368; H05K 1/189; H05K 2201/10136
See application file for complete search history.

(56) References Cited

U.S. PATENT DOCUMENTS

2020/0410195 A1* 12/2020 Kim .................... G06V 40/1306
2021/0264126 A1    8/2021 Yang et al.
(Continued)

FOREIGN PATENT DOCUMENTS

CN    106951130 A    7/2017
CN    110265457 A    9/2019
(Continued)

OTHER PUBLICATIONS

International Search Report in International application No. PCT/CN2021/137475, mailed on Jul. 28, 2022.
(Continued)

*Primary Examiner* — Abdul-Samad A Adediran
(74) *Attorney, Agent, or Firm* — Nathan & Associates; Menachem Nathan (57) ABSTRACT

The embodiment of the present application discloses a display device, including a display panel and an ultrasonic fingerprint sensor. The display panel includes a substrate and a thin film transistor arranged on the substrate, and the substrate is provided with a via hole; the ultrasonic fingerprint sensor is fabricated on a side of the substrate away from the thin film transistor to reduce the thickness of the display device.

20 Claims, 4 Drawing Sheets

(51) Int. Cl.
  *G02F 1/1368* (2006.01)
  *G06V 40/13* (2022.01)
  *H05K 1/18* (2006.01)
(52) U.S. Cl.
  CPC ........... *G02F 1/1368* (2013.01); *H05K 1/189* (2013.01); *H05K 2201/10136* (2013.01)

(56) References Cited

U.S. PATENT DOCUMENTS

2021/0354170 A1  11/2021  Zhou
2021/0359074 A1  11/2021  You et al.

FOREIGN PATENT DOCUMENTS

| CN | 210575960 U | 5/2020 |
| CN | 111682045 A | 9/2020 |
| CN | 113419645 A | 9/2021 |
| CN | 113506514 A | 10/2021 |

OTHER PUBLICATIONS

Written Opinion of the International Search Authority in International application No. PCT/CN2021/137475, mailed on Jul. 28, 2022.
Chinese Office Action issued in corresponding Chinese Patent Application No. 202111486764.2 dated Apr. 29, 2023, pp. 1-5.

\* cited by examiner

DISPLAY DEVICE

FIELD OF THE INVENTION

The present application relates to a display technology field, and more particularly to a display device.

BACKGROUND OF THE INVENTION

Ultrasonic fingerprint recognition is to scan the finger with a specific frequency ultrasonic wave emitted by the fingerprint module. Since ultrasonic waves are absorbed, penetrated, and reflected differently when they reach the surface of different materials, the difference in acoustic impedance between skin and air or different skin layers can be used to identify the location of the crest & valley of the fingerprint. Ultrasonic fingerprint recognition possesses the following advantages: it possesses stronger penetrability, and can perform deep subcutaneous fingerprint recognition and can identify living bodies, so the security of the program is higher; it is not easily interfered by oil stains, water stains and strong light.

In research and practice of the prior art, the inventor of the present application found that the known ultrasonic fingerprint recognition integrated solution is to stick the ultrasonic fingerprint module outside the display screen, which will increase the cost, increase the thickness of the screen, and reduce the comfort of use.

SUMMARY OF THE INVENTION

The embodiment of the present application provides a display device to reduce the thickness of the display device.

The embodiment of the present application provides a display device, comprising:
- a display panel, wherein the display panel comprises a substrate and a thin film transistor arranged on the substrate, and the substrate is provided with a via hole; and
- an ultrasonic fingerprint sensor, wherein the ultrasonic fingerprint sensor comprises:
- a first electrode, wherein the first electrode is arranged on a side of the substrate away from the thin film transistor; the first electrode is electrically connected to the thin film transistor through the via hole;
- a first insulating layer, wherein the first insulating layer is arranged on a side of the first electrode away from the thin film transistor;
- a piezoelectric layer, wherein the piezoelectric layer is arranged on a side of the first insulating layer away from the thin film transistor;
- a second electrode, wherein the second electrode is arranged on a side of the piezoelectric layer away from the thin film transistor; and
- a protective layer, wherein the protective layer is arranged on a side of the second electrode away from the thin film transistor;
- the thin film transistor comprises a first thin film transistor and a second thin film transistor insulated from each other, and the display panel further comprises a light emitting device provided on the first thin film transistor, and the light emitting device is electrically connected to the first thin film transistor, and the first electrode is electrically connected to the second thin film transistor;
- there are a plurality of first electrodes, and the second electrode is a surface electrode, and the plurality of first electrodes overlaps one of the second electrodes.

Optionally, in some embodiments of the present application, the display device comprises a first flexible circuit board and a second flexible circuit board;
the first flexible circuit board is bonded on the substrate, and the second flexible circuit board is bonded on the side of the substrate away from the thin film transistor; the first flexible circuit board is electrically connected to the first thin film transistor and the second thin film transistor, and the second flexible circuit board is electrically connected to the second electrode.

Optionally, in some embodiments of the present application, the substrate is provided with a first bonding pad, a second bonding pad and a third bonding pad, and the first bonding pad is connected to the first thin film transistor, and the second bonding pad is connected to the second thin film transistor;
the display panel further comprise a lead, and the lead is arranged on a side surface of the substrate, and the third bonding pad is connected to the second electrode through the lead;
the display device further comprises a flexible circuit board, and the flexible circuit board is bonded and connected to the first bonding pad, the second bonding pad and the third bonding pad, respectively.

Optionally, in some embodiments of the present application, the first electrode is respectively overlapped with the first thin film transistor and the second thin film transistor, and the first electrode is a light-shielding electrode.

Optionally, in some embodiments of the present application, the thin film transistor comprises a buffer layer, an active layer, a second insulating layer, a first metal layer, a third insulating layer, a second metal layer, a fourth insulating layer, a third metal layer and planarization layer, which are sequentially arranged on substrate;
the via hole further penetrates the buffer layer, the second insulating layer, the third insulating layer and the fourth insulating layer;
the active layer comprises a first active part and a second active part, the first metal layer comprises a first gate and a second gate, and the third metal layer comprises a first source, a second source, a first drain and a second drain;
the first active part, the first gate, the first source and the first drain form the first thin film transistor; the second active part, the second gate, the second source and the second drain form the second thin film transistor, and the second drain is connected to the first electrode through the via hole.

Optionally, in some embodiments of the present application, a plurality of the first electrodes are arranged in rows and columns, and at least one row or at least one column of the first electrodes is connected to one of the second thin film transistors.

Optionally, in some embodiments of the present application, the display panel further comprises an encapsulation layer sequentially arranged on the thin film transistor, and the encapsulation layer covers the light emitting device.

Optionally, in some embodiments of the present application, a hole structure is arranged in the protective layer.

The embodiment of the present application further provides a display device, comprising:
- a display panel, wherein the display panel comprises a substrate and a thin film transistor arranged on the substrate, and the substrate is provided with a via hole; and
- an ultrasonic fingerprint sensor, wherein the ultrasonic fingerprint sensor comprises:

a first electrode, wherein the first electrode is arranged on a side of the substrate away from the thin film transistor; the first electrode is connected to the thin film transistor through the via hole;

a first insulating layer, wherein the first insulating layer is arranged on a side of the first electrode away from the thin film transistor;

a piezoelectric layer, wherein the piezoelectric layer is arranged on a side of the first insulating layer away from the thin film transistor;

a second electrode, wherein the second electrode is arranged on a side of the piezoelectric layer away from the thin film transistor; and a protective layer, wherein the protective layer is arranged on a side of the second electrode away from the thin film transistor.

Optionally, in some embodiments of the present application, the thin film transistor comprises a first thin film transistor and a second thin film transistor insulated from each other, and the display panel further comprises a light emitting device provided on the first thin film transistor, and the light emitting device is electrically connected to the first thin film transistor, and the first electrode is electrically connected to the second thin film transistor.

Optionally, in some embodiments of the present application, the display device comprises a first flexible circuit board and a second flexible circuit board;

the first flexible circuit board is bonded on the substrate, and the second flexible circuit board is bonded on the side of the substrate away from the thin film transistor; the first flexible circuit board is electrically connected to the first thin film transistor and the second thin film transistor, and the second flexible circuit board is electrically connected to the second electrode.

Optionally, in some embodiments of the present application, the substrate is provided with a first bonding pad, a second bonding pad and a third bonding pad, and the first bonding pad is connected to the first thin film transistor, and the second bonding pad is connected to the second thin film transistor;

the display panel further comprise a lead, and the lead is arranged on a side surface of the substrate, and the third bonding pad is connected to the second electrode through the lead;

the display device further comprises a flexible circuit board, and the flexible circuit board is bonded and connected to the first bonding pad, the second bonding pad and the third bonding pad, respectively.

Optionally, in some embodiments of the present application, the first electrode is respectively overlapped with the first thin film transistor and the second thin film transistor, and the first electrode is a light-shielding electrode.

Optionally, in some embodiments of the present application, the thin film transistor comprises a buffer layer, an active layer, a second insulating layer, a first metal layer, a third insulating layer, a second metal layer, a fourth insulating layer, a third metal layer and planarization layer, which are sequentially arranged on substrate;

the via hole further penetrates the buffer layer, the second insulating layer, the third insulating layer and the fourth insulating layer;

the active layer comprises a first active part and a second active part, the first metal layer comprises a first gate and a second gate, and the third metal layer comprises a first source, a second source, a first drain and a second drain;

the first active part, the first gate, the first source and the first drain form the first thin film transistor; the second active part, the second gate, the second source and the second drain form the second thin film transistor, and the second drain is connected to the first electrode through the via hole.

Optionally, in some embodiments of the present application, there are a plurality of first electrodes, and the second electrode is a surface electrode, and the plurality of first electrodes overlaps one of the second electrodes.

Optionally, in some embodiments of the present application, a plurality of the first electrodes are arranged in rows and columns, and at least one row or at least one column of the first electrodes is connected to one of the second thin film transistors.

Optionally, in some embodiments of the present application, the display panel further comprises an encapsulation layer sequentially arranged on the thin film transistor, and the encapsulation layer covers the light emitting device.

Optionally, in some embodiments of the present application, the display panel further comprises an array substrate, a liquid crystal layer and an opposite substrate, and the array substrate comprises the substrate, the thin film transistor and a pixel electrode arranged on the thin film transistor.

Optionally, in some embodiments of the present application, the first insulating layer is doped with conductive particles. The conductive particles can be metal particles, for instance, one or more of nickel, gold and silver can coexist. In addition, graphite particles with excellent conductivity can also be employed instead of metal particles. The first insulating layer is doped with conductive particles to enhance the conductivity of the first electrode, thereby improving the performance of the ultrasonic fingerprint sensor.

Optionally, in some embodiments of the present application, a hole structure is arranged in the protective layer to shield external interference sound and absorb external impact.

The display device of the embodiment of the present application comprises a display panel and an ultrasonic fingerprint sensor. The display panel includes a substrate and a thin film transistor arranged on the substrate, and the substrate is provided with a via hole; the ultrasonic fingerprint sensor is fabricated on a side of the substrate away from the thin film transistor to reduce the thickness of the display device.

Besides, the ultrasonic fingerprint sensor comprises a first electrode, a first insulating layer, a piezoelectric layer, a second electrode and a protective layer; the first electrode is arranged on a side of the substrate away from the thin film transistor; the first electrode is connected to the thin film transistor through the via hole; the first insulating layer is arranged on a side of the first electrode away from the thin film transistor; the piezoelectric layer is arranged on a side of the first insulating layer away from the thin film transistor; the second electrode is arranged on a side of the piezoelectric layer away from the thin film transistor; the protective layer is arranged on a side of the second electrode away from the thin film transistor to protect the ultrasonic fingerprint sensor.

BRIEF DESCRIPTION OF THE DRAWINGS

In order to more clearly illustrate the embodiments of the present application, the following figures will be described in the embodiments are briefly introduced. It is obvious that the drawings are only some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of skilled in the premise of no creative efforts obtained, should be considered within the scope of protection of the present application. Besides, it should be understood that the specific embodiments described herein are merely for illustrating and explaining the present application and are not intended to limit the present application. In this application, if no explanation is made to the contrary, the orientation words used such as "upper" and "lower" usually refer to the upper and lower of the device in actual use or working state, which specifically are the directions of the drawing in the figures; and "inner" and "outer" refer to the outline of the device.

The embodiment of the present application provides a display panel. The detail descriptions are introduced below. It should be noted that the order of description in the following embodiments is not meant to limit the preferred order of the embodiments.

Figure 1:
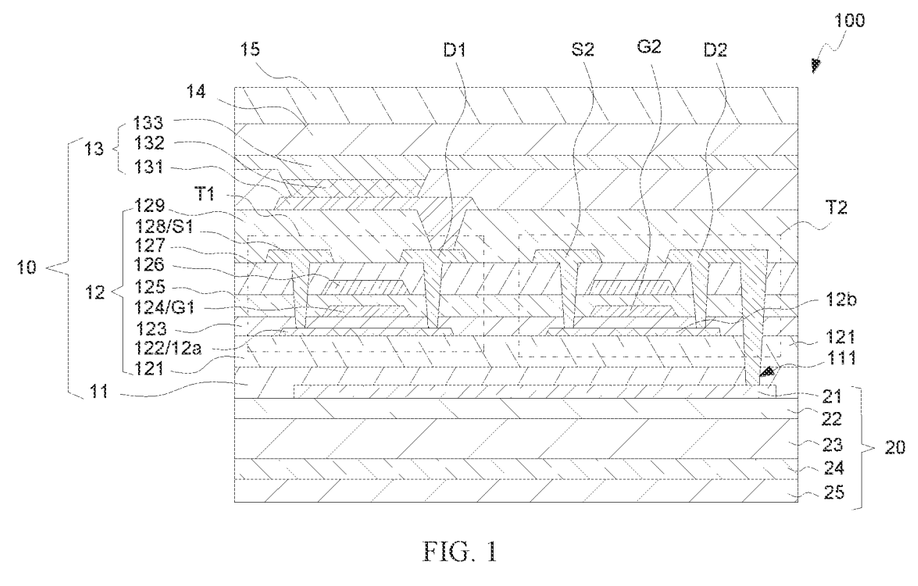
FIG. 1 is a structural diagram of a display device provided by an embodiment of the present application.

Please refer to FIG. 1. The embodiment of the present application provides a display device 100, comprising a display panel 10 and an ultrasonic fingerprint sensor 20.

The display panel 10 comprises a substrate 11 and a thin film transistor 12 arranged on the substrate 11. The substrate 11 is provided with a via hole 111.

The ultrasonic fingerprint sensor 20 is fabricated on a side of the substrate 11 away from the thin film transistor 12. The ultrasonic fingerprint sensor 20 is connected to the thin film transistor 12 through the via hole 111.

In the display device 100 of the embodiment of the present application, the ultrasonic fingerprint sensor 20 is fabricated on a side of the substrate 11 away from the thin film transistor 12 to reduce the thickness of the display device 100.

Optionally, the ultrasonic fingerprint sensor 20 comprises a first electrode 21, a first insulating layer 22, a piezoelectric layer 23, a second electrode 24 and a protective layer 25.

The first electrode 21 is arranged on a side of the substrate 11 away from the thin film transistor 12. The first electrode 21 is connected to the thin film transistor 12 through the via hole 111. The first insulating layer 22 is arranged on a side of the first electrode 21 away from the thin film transistor 12. The piezoelectric layer 23 is arranged on a side of the first insulating layer 22 away from the thin film transistor 12. The second electrode 24 is arranged on a side of the piezoelectric layer 23 away from the thin film transistor 12. The protective layer 25 is arranged on a side of the second electrode 24 away from the thin film transistor 12 to protect the ultrasonic fingerprint sensor.

In the display device 100 of this embodiment, the first electrode 21, the first insulating layer 22, the piezoelectric layer 23, the second electrode 24 and the protective layer 25 are sequentially formed on the side of the substrate 11 away from the thin film transistor 12, to avoid the use of external mounting method to arrange the ultrasonic fingerprint sensor 20, thereby making the display device 100 thinner. In addition, the arrangement of the protective layer 25 reduces the risk of water and oxygen entering the inside of the ultrasonic fingerprint sensor 20 and reduces the risk of being scratched.

In some embodiments, the first electrode 21 can be formed on a side of the substrate 11 away from the thin film transistor 12; the piezoelectric layer 23, the second electrode 24 and the protective layer 25 can be adhered on the first electrode 21. That is, the material of the first insulating layer 22 comprises insulating glue. Compared with the completely externally mounted method, this arrangement also achieves the effect of making the display device 100 thinner.

The display panel 10 further comprises a reading circuit. The process of fingerprint recognition in this embodiment is to provide the voltage to the first electrode 21 and the second electrode 24, and the piezoelectric layer 23 converts electrical energy into mechanical energy due to the voltage difference between the first electrode 21 and the second electrode 24, and emits the ultrasound. The finger receives the ultrasonic wave and reflects it back to the piezoelectric layer 23. The piezoelectric layer 23 converts mechanical energy into electrical energy, and a voltage is formed at both ends of the piezoelectric layer 23. Since the phases of the reflected ultrasonic waves from the finger crest and the finger valley are different, the first electrodes 21 in different regions correspondingly induce different induced charges, and the fingerprint image is recognized by the reading circuit.

Optionally, the ultrasonic fingerprint sensor 20 may be correspondingly arranged in a partial region of the display panel 10 to realize a partial fingerprint recognition; or it can also be correspondingly arranged in the display area of the entire display panel 10 to realize comprehensive fingerprint recognition.

Optionally, the display panel 10 may be a light emitting diode display panel, such as an organic light emitting diode display panel or a quantum dot light emitting diode display panel; or it can also be a liquid crystal display panel, a micro light emitting diode display panel, or a mini light emitting diode display panel.

In one embodiment of the present application, an organic light emitting diode display panel is illustrated for description, as shown in FIG. 1, but is not limited thereto. Optionally, the thin film transistor 12 comprises a first thin film transistor T1 and a second thin film transistor T2 insulated from each other. The display panel 10 further comprises a light emitting device 13 provided on the first thin film transistor T1, and the light emitting device 13 is electrically connected to the first thin film transistor T1. The first electrode 21 is electrically connected to the second thin film transistor T2.

The display panel 10 further comprises an encapsulation layer 14 sequentially arranged on the thin film transistor 12, and the encapsulation layer 14 covers the light emitting device 13.

The light emitting device 13 comprises a pixel electrode 131, an organic light emitting layer 132 and an opposite electrode 133. The encapsulation layer 14 is arranged on the light emitting device 13.

Optionally, the display panel 10 further comprises a touch layer 15, and the touch layer 15 is arranged on the encapsulation layer 14.

Figure 2:
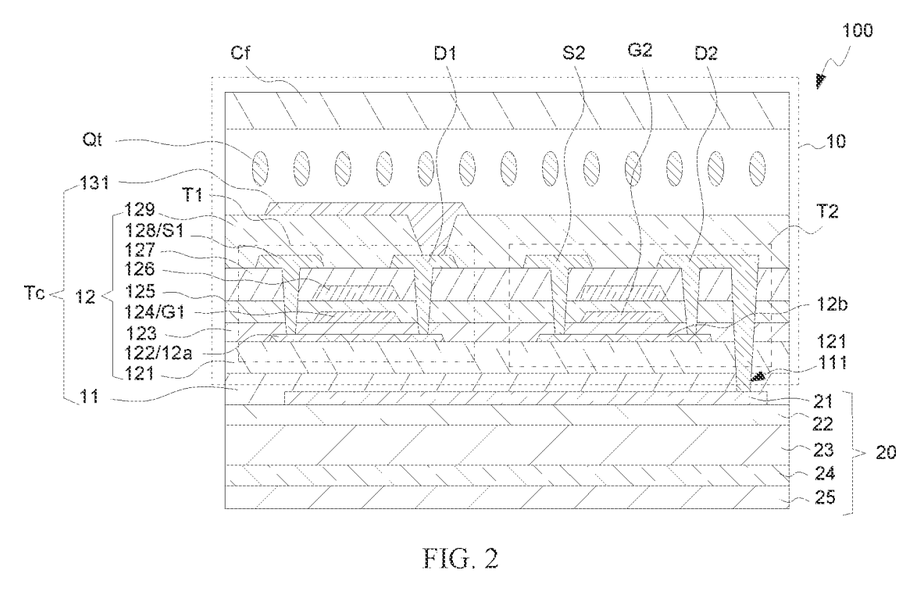
FIG. 2 is another structural diagram of a display device provided by an embodiment of the present application.

In some embodiments, please refer to FIG. 2. Optionally, the display panel 10 is a liquid crystal display panel. The display panel 10 further comprises an array substrate Tc, a liquid crystal layer Qt and an opposite substrate Cf. The array substrate Tc comprises the substrate 11, the thin film transistor 12 and a pixel electrode 131 arranged on the thin film transistor 12.

Optionally, the material of the first electrode 21 can be oxides such as indium tin oxide, indium zinc oxide, etc.; it can also be various conductive metals, alloys, compounds and mixtures thereof, for instance, gold, silver, platinum, copper, tungsten, molybdenum, iron, aluminum, aluminum-silicon, aluminum-titanium, metal material nitrides, etc. can be adopted.

Optionally, the material of the first insulating layer 22 may be at least one of silicon nitride, silicon oxide and organic materials; for instance, transparent photoresist, epoxy resin, polyimide, polyvinyl alcohol, polymethyl methacrylate, polystyrene, etc.

Optionally, the material of the piezoelectric layer 23 may be polyvinylidene fluoride (PVDF) and its copolymers, polypropylene or piezoelectric crystals.

Optionally, the material of the second electrode 24 can be oxides such as indium tin oxide, indium zinc oxide, etc.; it can also be various conductive metals, alloys, compounds and mixtures thereof, for instance, gold, silver, platinum, copper, tungsten, molybdenum, iron, aluminum, aluminum-silicon, aluminum-titanium, metal material nitrides, etc. can be adopted.

Optionally, the material of the protective layer 25 may be an inorganic material, such as silicon nitride, silicon oxide, aluminum oxide or silicon oxynitride.

In some embodiments, the material of the first electrode 21 may be indium tin oxide to improve the uniformity, flatness and oxygen resistance of the first electrode 21; in addition, since indium tin oxide does not react with polyvinylidene fluoride (PVDF), the stability of the ultrasonic fingerprint sensor 20 can be improved.

The material of the second electrode 24 may be silver. Since silver possesses a low resistivity and good uniformity, the conductivity and stability of the second electrode 24 can be improved.

Optionally, it needs to be explained that in the circuit structure, the reading circuit comprises the second thin film transistor T2.

Figure 3:
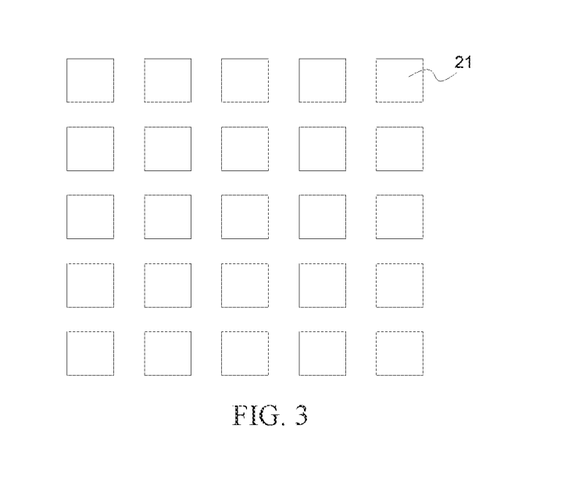
FIG. 3 is an arrangement diagram of the first electrodes of the display device provided by the embodiment of the present application.

Optionally, referring to FIG. 3, there are a plurality of first electrodes 21, and the second electrode 24 is a surface electrode. The plurality of first electrodes 21 overlaps one of the second electrodes 24.

The arrangement that the plurality of first electrodes 21 correspond to one second electrode 24 simplifies the manufacturing process and the layout structure.

Specifically, the plurality of the first electrodes 21 are arranged in rows and columns, and at least one row or at least one column of the first electrodes 21 is connected to one of the second thin film transistors T2.

In some embodiments, it can be that one first electrode 21 is correspondingly connected to one second thin film transistor T2.

Optionally, the shape of the first electrode 21 may be a circle, a rhombus, a rectangle, a rounded rectangle, a regular pentagon, a regular hexagon or the like. In this embodiment, a rectangle is taken as an illustration, but it is not limited to this.

Figure 4:
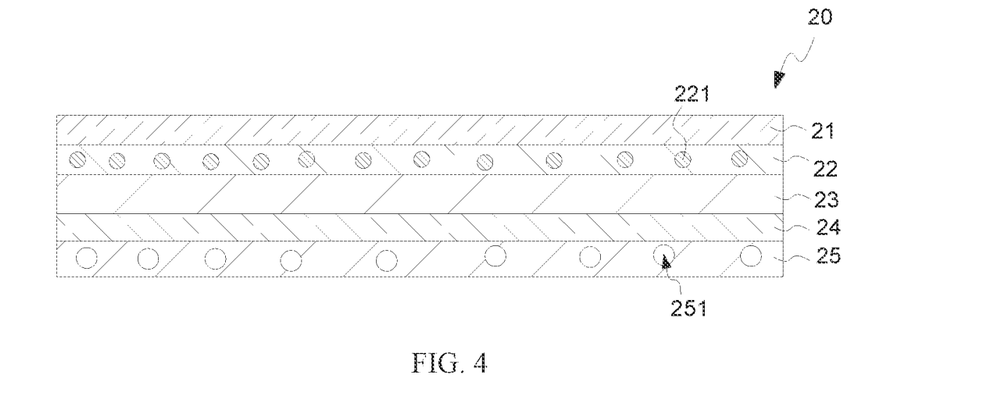
FIG. 4 is a diagram of another structure of an ultrasonic fingerprint sensor of the display device provided by the embodiment of the present application.

Optionally, in some embodiments of the present application, referring to FIG. 4, the first insulating layer 22 is doped with conductive particles 221. The conductive particles 221 can be metal particles, for instance, one or more of nickel, gold and silver can coexist. In addition, graphite particles with excellent conductivity can also be employed instead of metal particles. The first insulating layer 22 is doped with conductive particles to enhance the conductivity of the first electrode 21, thereby improving the performance of the ultrasonic fingerprint sensor 20.

Optionally, in some embodiments of the present application, referring to FIG. 4, a hole structure 251 can be further arranged in the protective layer 25 to shield external interference sound and absorb external impact.

Figure 5:
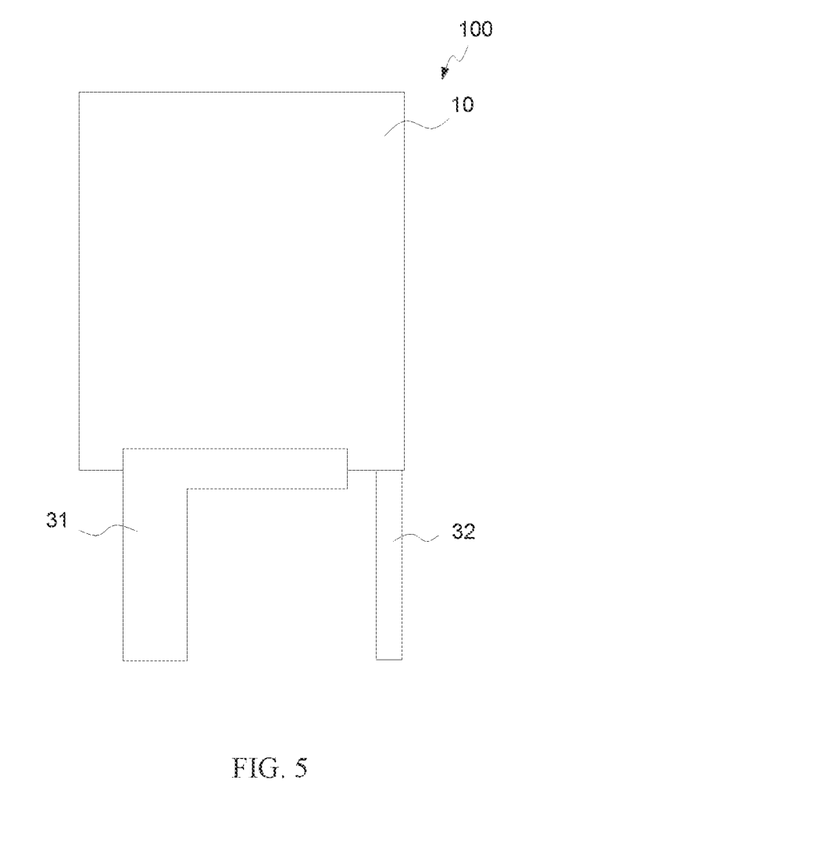
FIG. 5 is a diagram of a first top view structure of the display device provided by an embodiment of the present application.
Figure 6:
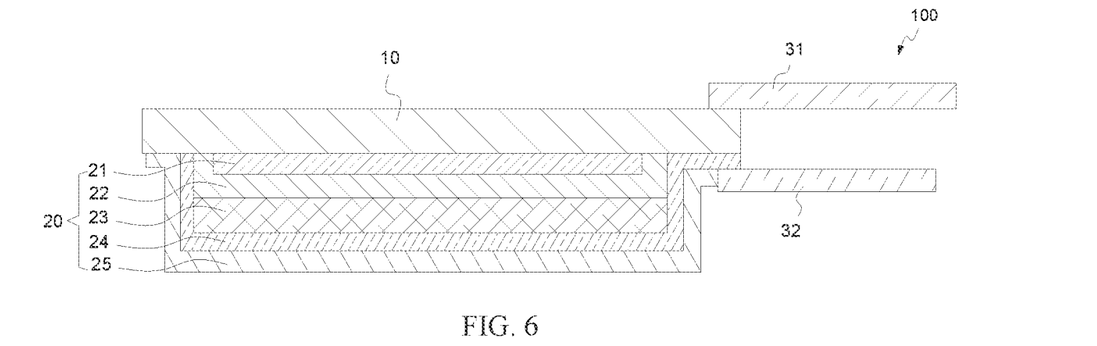
FIG. 6 is a diagram of a first sectional view structure of the display device provided by an embodiment of the present application.

Optionally, referring to FIG. 5 and FIG. 6, the display device 100 comprises a first flexible circuit board 31 and a second flexible circuit board 32.

The first flexible circuit board 31 is bonded on the substrate 11. The second flexible circuit board 32 is bonded to the side of the substrate 11 away from the thin film transistor 12. The first flexible circuit board 31 is electrically connected to the first thin film transistor T1 and the second thin film transistor T2. The second flexible circuit board 32 is electrically connected to the second electrode 24.

The display device 100 of this embodiment adopts the first flexible circuit board 31 and the second flexible circuit board 32 to connect the display panel 10 and the ultrasonic fingerprint sensor 20 correspondingly, so as to reduce the loading.

Optionally, in some embodiments, the display device 100 of the embodiment of the present application may also employs a flexible circuit board 30 to electrically connect the display panel 10 and the ultrasonic fingerprint sensor 20 at the same time. Please refer to FIG. 7 and FIG. 8. The substrate 11 is provided with a first bonding pad 112, a second bonding pad 113 and a third bonding pad 114. The first bonding pad 112 is connected to the first thin film transistor T1. The second bonding pad 113 is connected to the second thin film transistor T2. The first bonding pad 112 and the second bonding pad 113 are alternately arranged.

Figure 7:
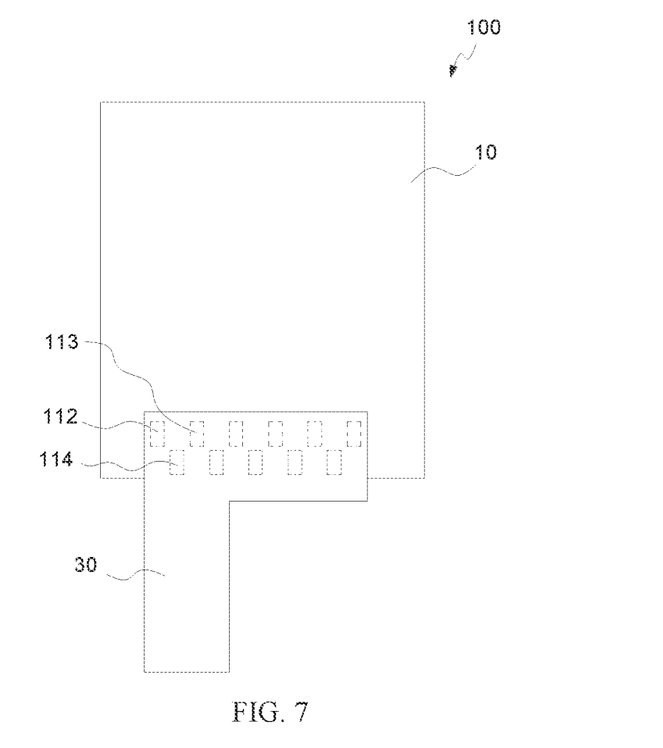
FIG. 7 is a diagram of a second top view structure of the display device provided by an embodiment of the present application.
Figure 8:
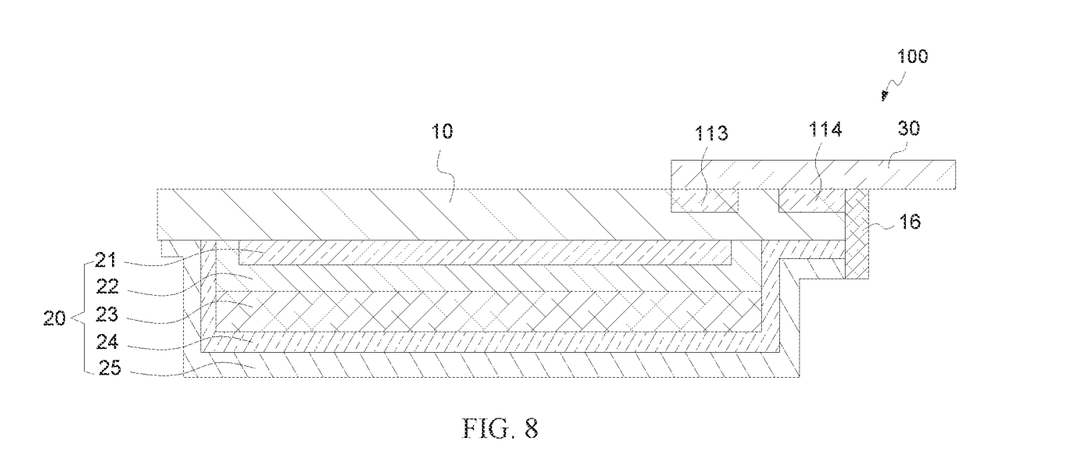
FIG. 8 is a diagram of a second sectional view structure of the display device provided by an embodiment of the present application.

The display panel 10 further comprises a lead 16, and the lead 16 is arranged on a side surface of the substrate 11. The third bonding pad 114 is connected to the second electrode 24 through the lead 16.

The display device 100 further comprises a flexible circuit board 30. The flexible circuit board 30 is bonded and connected to the first bonding pad 112, the second bonding pad 113 and the third bonding pad 114, respectively.

In this embodiment, the flexible circuit board 30 is employed to electrically connect the display panel 10 and the ultrasonic fingerprint sensor 20 at the same time, saving a flexible circuit board.

An option for the reading circuit, the first electrode 21 is overlapped with the first thin film transistor T1 and the second thin film transistor T2, and the first electrode 21 is a light-shielding electrode.

The first electrode 21 is a light-shielding electrode, and the first electrode 21 is overlapped with the first thin film transistor T1 and the second thin film transistor T2. It achieves the effect of employing the first electrode 21 to shield the first thin film transistor T1 and the second thin film transistor T2, to avoid that light is irradiated to the first thin film transistor T1 and the second thin film transistor T2, and the process of preparing the light-shielding layer of the display panel 10 is eliminated.

Optionally, the thin film transistor 12 comprises a buffer layer 121, an active layer 122, a second insulating layer 123, a first metal layer 124, a third insulating layer 125, a second metal layer 126, a fourth insulating layer 127, a third metal layer 128 and planarization layer 129, which are sequentially arranged on substrate 11.

The via hole 111 further penetrates the buffer layer 121, the second insulating layer 123, the third insulating layer 125 and the fourth insulating layer 127.

The active layer 122 comprises a first active part 12a and a second active part 12b. The first metal layer 124 comprises a first gate G1 and a second gate G2. The third metal layer 128 comprises a first source S1, a second source S2, a first drain D1 and a second drain D2.

The first active part 12a, the first gate G1, the first source S1 and the first drain D1 form the first thin film transistor T1. The second active part 12b, the second gate G2, the second source S2 and the second drain D2 form the second thin film transistor T2. The second drain D2 is connected to the first electrode 21 through the via hole 111.

It should be noted that although the embodiment of the present application only shows that the first thin film transistor T1 and the second thin film transistor T2 are top gate type, in some embodiments, the first thin film transistor T1 and the second thin film transistor T2 may also be bottom-gate or double-gate thin film transistors, which will not be repeated here.

Optionally, the material of the active layer 122 may be oxide semiconductor, polysilicon or amorphous silicon.

The display device 100 of the embodiment of the present application comprises a display panel 10 and an ultrasonic fingerprint sensor 20. The display panel 10 comprises a substrate 11 and a thin film transistor 12 arranged on the substrate 11, and the substrate 11 is provided with a via hole 111; the ultrasonic fingerprint sensor 20 is fabricated on a side of the substrate 11 away from the thin film transistor 12 to reduce the thickness of the display device 100.

Besides, the ultrasonic fingerprint sensor 20 comprises a first electrode 21, a first insulating layer 22, a piezoelectric layer 23, a second electrode 24 and a protective layer 25. The first electrode 21 is arranged on a side of the substrate 11 away from the thin film transistor 12. The first electrode 21 is connected to the thin film transistor 12 through the via hole 111. The first insulating layer 22 is arranged on a side of the first electrode 21 away from the thin film transistor 12. The piezoelectric layer 23 is arranged on a side of the first insulating layer 22 away from the thin film transistor 12. The second electrode 24 is arranged on a side of the piezoelectric layer 23 away from the thin film transistor 12. The protective layer 25 is arranged on a side of the second electrode 24 away from the thin film transistor 12 to protect the ultrasonic fingerprint sensor 20.

The display device provided by the embodiments of the present application are described in detail as aforementioned, and the principles and implementations of the present application have been described with reference to specific illustrations. The description of the foregoing embodiments is merely for helping to understand the technical solutions of the present application and the core ideas thereof; meanwhile, those skilled in the art will be able to change the specific embodiments and the scope of the application according to the idea of the present application. In conclusion, the content of the specification should not be construed as limiting the present application.

What is claimed is:

1. A display device, comprising:
   a display panel, wherein the display panel comprises a substrate and a thin film transistor arranged on the substrate, and the substrate is provided with a via hole; and
   an ultrasonic fingerprint sensor, wherein the ultrasonic fingerprint sensor comprises:
   a first electrode, wherein the first electrode is arranged on a side of the substrate away from the thin film transistor; the first electrode is electrically connected to the thin film transistor through the via hole;
   a first insulating layer, wherein the first insulating layer is arranged on a side of the first electrode away from the thin film transistor;
   a piezoelectric layer, wherein the piezoelectric layer is arranged on a side of the first insulating layer away from the thin film transistor;
   a second electrode, wherein the second electrode is arranged on a side of the piezoelectric layer away from the thin film transistor; and
   a protective layer, wherein the protective layer is arranged on a side of the second electrode away from the thin film transistor;
   the thin film transistor comprises a first thin film transistor and a second thin film transistor insulated from each other, and the display panel further comprises a light emitting device provided on the first thin film transistor, and the light emitting device is electrically connected to the first thin film transistor, and the first electrode is electrically connected to the second thin film transistor;
   there are a plurality of first electrodes, and the second electrode is a surface electrode, and the plurality of first electrodes overlaps the second electrode.

2. The display device according to claim 1, wherein the display device comprises a first flexible circuit board and a second flexible circuit board;
   the first flexible circuit board is bonded on the substrate, and the second flexible circuit board is bonded on the side of the substrate away from the thin film transistor; the first flexible circuit board is electrically connected to the first thin film transistor and the second thin film transistor, and the second flexible circuit board is electrically connected to the second electrode.

3. The display device according to claim 1, wherein the substrate is provided with a first bonding pad, a second bonding pad and a third bonding pad, and the first bonding pad is connected to the first thin film transistor, and the second bonding pad is connected to the second thin film transistor;

the display panel further comprise a lead, and the lead is arranged on a side surface of the substrate, and the third bonding pad is connected to the second electrode through the lead;

the display device further comprises a flexible circuit board, and the flexible circuit board is bonded and connected to the first bonding pad, the second bonding pad and the third bonding pad, respectively.

4. The display device according to claim 2, wherein the first electrode is respectively overlapped with the first thin film transistor and the second thin film transistor, and the first electrode is a light-shielding electrode.

5. The display device according to claim 3, wherein the thin film transistor comprises a buffer layer, an active layer, a second insulating layer, a first metal layer, a third insulating layer, a second metal layer, a fourth insulating layer, a third metal layer and planarization layer, which are sequentially arranged on substrate;

the via hole further penetrates the buffer layer, the second insulating layer, the third insulating layer and the fourth insulating layer;

the active layer comprises a first active part and a second active part, the first metal layer comprises a first gate and a second gate, and the third metal layer comprises a first source, a second source, a first drain and a second drain;

the first active part, the first gate, the first source and the first drain form the first thin film transistor; the second active part, the second gate, the second source and the second drain form the second thin film transistor, and the second drain is connected to the first electrode through the via hole.

6. The display device according to claim 5, wherein a plurality of the first electrodes are arranged in rows and columns, and at least one of the rows or at least one of the columns of the first electrodes is connected to the second thin film transistor.

7. The display device according to claim 1, wherein the display panel further comprises an encapsulation layer sequentially arranged on the thin film transistor, and the encapsulation layer covers the light emitting device.

8. The display device according to claim 1, wherein a hole structure is arranged in the protective layer.

9. A display device, comprising:
a display panel, wherein the display panel comprises a substrate and a thin film transistor arranged on the substrate, and the substrate is provided with a via hole; and
an ultrasonic fingerprint sensor, wherein the ultrasonic fingerprint sensor comprises:
a first electrode, wherein the first electrode is arranged on a side of the substrate away from the thin film transistor; the first electrode is electrically connected to the thin film transistor through the via hole;
a first insulating layer, wherein the first insulating layer is arranged on a side of the first electrode away from the thin film transistor;
a piezoelectric layer, wherein the piezoelectric layer is arranged on a side of the first insulating layer away from the thin film transistor;
a second electrode, wherein the second electrode is arranged on a side of the piezoelectric layer away from the thin film transistor; and
a protective layer, wherein the protective layer is arranged on a side of the second electrode away from the thin film transistor.

10. The display device according to claim 9, wherein the thin film transistor comprises a first thin film transistor and a second thin film transistor insulated from each other, and the display panel further comprises a light emitting device provided on the first thin film transistor, and the light emitting device is electrically connected to the first thin film transistor, and the first electrode is electrically connected to the second thin film transistor.

11. The display device according to claim 10, wherein the display device comprises a first flexible circuit board and a second flexible circuit board;

the first flexible circuit board is bonded on the substrate, and the second flexible circuit board is bonded on the side of the substrate away from the thin film transistor;

the first flexible circuit board is electrically connected to the first thin film transistor and the second thin film transistor, and the second flexible circuit board is electrically connected to the second electrode.

12. The display device according to claim 10, wherein the substrate is provided with a first bonding pad, a second bonding pad and a third bonding pad, and the first bonding pad is connected to the first thin film transistor, and the second bonding pad is connected to the second thin film transistor;

the display panel further comprise a lead, and the lead is arranged on a side surface of the substrate, and the third bonding pad is connected to the second electrode through the lead;

the display device further comprises a flexible circuit board, and the flexible circuit board is bonded and connected to the first bonding pad, the second bonding pad and the third bonding pad, respectively.

13. The display device according to claim 11, wherein the first electrode is respectively overlapped with the first thin film transistor and the second thin film transistor, and the first electrode is a light-shielding electrode.

14. The display device according to claim 12, wherein the thin film transistor comprises a buffer layer, an active layer, a second insulating layer, a first metal layer, a third insulating layer, a second metal layer, a fourth insulating layer, a third metal layer and planarization layer, which are sequentially arranged on substrate;

the via hole further penetrates the buffer layer, the second insulating layer, the third insulating layer and the fourth insulating layer;

the active layer comprises a first active part and a second active part, the first metal layer comprises a first gate and a second gate, and the third metal layer comprises a first source, a second source, a first drain and a second drain;

the first active part, the first gate, the first source and the first drain form the first thin film transistor; the second active part, the second gate, the second source and the second drain form the second thin film transistor, and the second drain is connected to the first electrode through the via hole.

15. The display device according to claim 9, wherein there are a plurality of first electrodes, and the second electrode is a surface electrode, and the plurality of first electrodes overlaps the second electrode.

16. The display device according to claim 15, wherein a plurality of the first electrodes are arranged in rows and columns, and at least one of the rows or at least one of the columns of the first electrodes is connected to the second thin film transistor.

17. The display device according to claim 10, wherein the display panel further comprises an encapsulation layer sequentially arranged on the thin film transistor, and the encapsulation layer covers the light emitting device.

18. The display device according to claim 9, wherein a hole structure is arranged in the protective layer.

19. The display device according to claim 9, wherein the first insulating layer is doped with conductive particles.

20. The display device according to claim 9, wherein the display panel further comprises an array substrate, a liquid crystal layer and an opposite substrate, and the array substrate comprises the substrate, the thin film transistor and a pixel electrode arranged on the thin film transistor.

* * * * *